(12) United States Patent
Shih et al.

(10) Patent No.: US 11,342,428 B2
(45) Date of Patent: May 24, 2022

(54) SEMICONDUCTOR DEVICE

(71) Applicants: Panasonic Corporation, Kadoma (JP); OSAKA UNIVERSITY, Suita (JP)

(72) Inventors: Hong-An Shih, Kyoto (JP); Satoshi Nakazawa, Osaka (JP); Naohiro Tsurumi, Kyoto (JP); Yoshiharu Anda, Osaka (JP); Heiji Watanabe, Osaka (JP); Takayoshi Shimura, Osaka (JP); Takuji Hosoi, Osaka (JP); Mikito Nozaki, Osaka (JP); Takahiro Yamada, Osaka (JP)

(73) Assignees: Panasonic Holdings Corporation, Osaka (JP); OSAKA UNIVERSITY, Osaka (JP)

( * ) Notice: Subject to any disclaimer, the term of this patent is extended or adjusted under 35 U.S.C. 154(b) by 15 days.

(21) Appl. No.: 16/732,639

(22) Filed: Jan. 2, 2020

(65) Prior Publication Data

US 2020/0135876 A1 Apr. 30, 2020

Related U.S. Application Data

(63) Continuation of application No. PCT/JP2018/021805, filed on Jun. 7, 2018.

(30) Foreign Application Priority Data

Jul. 7, 2017 (JP) .............................. JP2017-134145

(51) Int. Cl.
*H01L 29/423* (2006.01)
*H01L 29/207* (2006.01)
(Continued)

(52) U.S. Cl.
CPC ........ *H01L 29/4232* (2013.01); *H01L 29/207* (2013.01); *H01L 29/7787* (2013.01); *H01L 29/78* (2013.01)

(58) Field of Classification Search
CPC ............... H01L 29/4232; H01L 29/207; H01L 29/7787; H01L 29/78; H01L 29/42376;
(Continued)

(56) References Cited

U.S. PATENT DOCUMENTS

| 5,757,020 A | 5/1998 | Torazawa et al. |
| 2007/0045670 A1 | 3/2007 | Kuraguchi |

(Continued)

FOREIGN PATENT DOCUMENTS

| JP | 8-79041 A | 3/1996 |
| JP | 2007-67240 A | 3/2007 |

(Continued)

OTHER PUBLICATIONS

International Search Report w/English translation and Written Opinion in Japanese dated Aug. 28, 2018, issued in counterpart International Application No. PCT/JP2018/021805 (12 pages).

*Primary Examiner* — Shahed Ahmed
(74) *Attorney, Agent, or Firm* — WHDA, LLP (57) ABSTRACT

A semiconductor device including: a metal-insulator-semiconductor (MIS) structure that includes a nitride semiconductor layer, a gate insulator film, and a gate electrode stacked in stated order; and a source electrode and a drain electrode that are disposed to sandwich the gate electrode in a plan view and contact the nitride semiconductor layer. The gate insulator film includes a threshold value control layer that includes an oxynitride film.

14 Claims, 6 Drawing Sheets

(51) Int. Cl.
*H01L 29/778* (2006.01)
*H01L 29/78* (2006.01)

(58) Field of Classification Search
CPC ............... H01L 29/513; H01L 29/4236; H01L 29/2003; H01L 29/7786; H01L 21/318; H01L 29/778–7789; H01L 29/66431; H01L 29/66462; H01L 29/51–518
See application file for complete search history.

(56) References Cited

U.S. PATENT DOCUMENTS

| | | |
|---|---|---|
| 2011/0227090 A1 | 9/2011 | Briere |
| 2012/0146134 A1* | 6/2012 | Kamada ............ H01L 29/66462 257/330 |
| 2013/0140605 A1* | 6/2013 | Ramdani ........... H01L 29/66462 257/192 |
| 2015/0318372 A1* | 11/2015 | Watanabe ........... H01L 29/1602 257/77 |
| 2016/0300941 A1 | 10/2016 | Cheng |
| 2017/0069747 A1* | 3/2017 | Saito .................... H01L 29/0657 |
| 2017/0104093 A1 | 4/2017 | Takado et al. |
| 2018/0069112 A1* | 3/2018 | Inumiya ............ H01L 29/66462 |

FOREIGN PATENT DOCUMENTS

| | | |
|---|---|---|
| JP | 4751150 B2 | 8/2011 |
| JP | 2011-199286 A | 10/2011 |
| JP | 2013-118377 A | 6/2013 |
| JP | 2014-110402 A | 6/2014 |
| JP | 2017-502519 A | 1/2017 |
| JP | 2017-73500 A | 4/2017 |

\* cited by examiner

FIG. 12

SEMICONDUCTOR DEVICE

CROSS REFERENCE TO RELATED APPLICATIONS

This is a continuation application of PCT International Application No. PCT/JP2018/021805 filed on Jun. 7, 2018, designating the United States of America, which is based on and claims priority of Japanese Patent Application No. 2017-134145 filed on Jul. 7, 2017. The entire disclosures of the above-identified applications, including the specifications, drawings and claims are incorporated herein by reference in their entirety.

FIELD

The present disclosure relates to a semiconductor device.

BACKGROUND

Gallium nitride (GaN) is conventionally used for short-wavelength optical elements since GaN has a wide band gap and a direct-transition band structure. Since GaN has a high electrical breakdown field and a high electron saturation velocity, using GaN in electronic devices such as field-effect transistors (FETs) is being studied. For example, heterojunction FETs (HFETs) having a stacked structure of a GaN layer and an AlGaN layer are known as high-frequency and high-output electronic devices. In HFETs, two-dimension electron gas (2DEG) that occurs at an interface between the GaN layer and the AlGaN layer is used as a channel.

Since HFETs have a high electron density of approximately $10^{13} cm^{-2}$ and the wide band gap of GaN, using HFETs as high-voltage power switching elements is being studied. In power switching elements using GaN, there is a strong demand for single power supplies compared to competing silicon (Si) transistors. To be specific, there is a strong demand for enhancement-mode (i.e., normally-off) power switching elements. Accordingly, techniques for controlling the threshold voltage of HFETs are actively being researched (see, for example, Patent Literature (PTL) 1 and 2).

CITATION LIST

Patent Literature

PTL 1: Japanese Unexamined Patent Application Publication No. 2007-67240
PTL 2: Japanese Unexamined Patent Application Publication No. 2011-199286

SUMMARY

Technical Problem

However, the above conventional semiconductor devices have the problem of poor threshold value controllability, making it difficult to implement a desired threshold voltage.

Accordingly, the present disclosure provides a semiconductor device having a desired threshold voltage.

Solution to Problem

In order to solve the above problem, a semiconductor device according to an aspect of the present disclosure includes: a metal-insulator-semiconductor (MIS) structure that includes a nitride semiconductor layer, a gate insulator film, and a gate electrode stacked in stated order; and a source electrode and a drain electrode that are disposed to sandwich the gate electrode in a plan view and contact the nitride semiconductor layer. The gate insulator film includes a threshold value control layer that includes an oxynitride film.

Advantageous Effects

The present disclosure makes it possible to provide a semiconductor device having a desired threshold voltage.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENTS

Underlying Knowledge Forming Basis of Present Disclosure

The inventors have identified the following problem regarding the conventional semiconductor devices mentioned in the column "Background."

PTL 1 discloses a semiconductor device having a recessed structure directly beneath a gate electrode. It is possible to adjust a threshold voltage by decreasing a film thickness of a threshold value control layer directly beneath the gate electrode.

In the semiconductor device recited in PTL 1, however, an AlGaN layer needs to be etched until the AlGaN layer has a film thickness of several nanometers in order to implement a normally-off operation. Accordingly, it is difficult to control the etching, causing variations in the threshold voltage. PTL 1 has the problem of a resistance in a portion directly beneath the gate electrode increasing.

PTL 2 discloses a configuration in which an AlSiN film is inserted, as a gate insulator film, between a gate electrode and an electron-supply layer. It is possible to adjust a threshold voltage by adjusting an Al content of the AlSiN film.

In the configuration recited in PTL 2, however, the AlSiN film is not capable of sufficiently functioning as the gate insulator film since it is not possible to form a large barrier layer between the AlSiN film and the electron-supply layer. Accordingly, PTL 2 has the problem of a gate leakage current increasing.

Accordingly, in order to solve the above problem, a semiconductor device according to an aspect of the present disclosure includes: a metal-insulator-semiconductor (MIS) structure that includes a nitride semiconductor layer, a gate insulator film, and a gate electrode stacked in stated order; and a source electrode and a drain electrode that are disposed to sandwich the gate electrode in a plan view and contact the nitride semiconductor layer. The gate insulator film includes a threshold value control layer that includes an oxynitride film.

This makes it possible to change the threshold voltage of the semiconductor device by changing a nitrogen composition ratio of the oxynitride film forming the threshold value control layer. For example, when the nitrogen composition ratio of the oxynitride film is increased, oxygen atoms are displaced by nitrogen atoms. When the nitrogen composition ratio of the oxynitride film is decreased, the nitrogen atoms are displaced by the oxygen atoms. In either case, the threshold voltage of the semiconductor device changes since an electron affinity of the gate insulator film changes.

In this manner, it is possible to also change the threshold voltage of the semiconductor device to a suitable value by adjusting a nitrogen composition of the oxynitride film to a suitable value. As such, the present disclosure makes it possible to provide a semiconductor device having a desired threshold voltage.

Note that the semiconductor device according to the present aspect does not need to have a recessed structure. Accordingly, it is possible to limit variations in the threshold voltage without controllability of the etching for forming the recessed structure becoming a problem.

The threshold value control layer may, for example, contain aluminum.

This makes it possible to implement a semiconductor device having a desired threshold voltage while ensuring favorable insulating properties as the gate insulator film. It is possible to limit the gate leakage current since the insulating properties are sufficiently high.

The nitrogen composition ratio of the threshold value control layer may be, for example, at least 3 at. % and at most 25 at. %.

This makes it possible to control the desired threshold voltage.

The nitrogen composition ratio of the threshold value control layer may be, for example, at least 3 at. % and at most 12 at. %.

This makes it possible to increase the threshold voltage to more than 1.5 V, which is a preferable voltage for use in power devices. For example, when using the semiconductor device as a switching element, it is possible to limit the occurrence of malfunctions since a switching operation is possible at a high voltage. This makes it possible to implement a safe and reliable semiconductor device.

The threshold value control layer may be, for example, amorphous or microcrystalline.

This makes it possible to decrease the gate leakage current since it is possible to decrease grain boundaries in the gate insulator film.

A nitrogen content in the threshold value control layer may, for example, decrease from the nitride semiconductor layer toward the gate electrode.

This makes it possible to limit hysteresis of the threshold voltage by increasing the nitrogen composition ratio in a region close to the nitride semiconductor layer in the gate insulator film. It is possible to increase the threshold voltage by decreasing the nitrogen composition ratio in a region close to the gate electrode in the gate insulator film.

The gate insulator film may further include, for example, a first insulation layer that is stacked on the threshold value control layer at a side of the gate electrode and may include one of an oxide film, a nitride film, or an oxynitride film.

The gate insulator film may further include, for example, a second insulation layer that is stacked on the threshold value control layer at a side of the nitride semiconductor layer and includes one of an oxide film, a nitride film, or an oxynitride film.

The gate insulator film may further include, for example, a first insulation layer that is stacked on the threshold value control layer at a side of the gate electrode and may include one of an oxide film, a nitride film, or an oxynitride film; and a second insulation layer that is stacked on the threshold value control layer at a side of the nitride semiconductor layer and includes one of an oxide film, a nitride film, or an oxynitride film.

This makes it possible to make the threshold voltage have a desired value by adjusting the nitrogen composition ratio of the oxynitride film forming the threshold value control layer even when the gate insulator film has a two-layer structure or three-layer structure including the threshold value control layer. It is, for example, also possible to limit a leakage current by stacking an oxide film including $SiO_2$ (silicon dioxide film) on the threshold value control layer. It is also possible to increase a dielectric constant of the gate insulator film by stacking an oxide film including $TiO_2$ (titanium dioxide film). It is possible to suitably change a stacked structure in accordance with a desired application of the semiconductor device.

The nitride semiconductor layer may have, for example, a stacked structure of GaN and $Al_xGa_{1-x}N$, where $0 \leq x \leq 1$.

This makes it possible to implement a FET having a high electrical breakdown field and a high electron saturation velocity.

For example, a gate recess may be disposed in the nitride semiconductor layer.

This makes it possible to further increase the threshold voltage.

The nitride semiconductor layer may include, for example, a first nitride semiconductor layer; and a second nitride semiconductor layer that is stacked on the first nitride semiconductor layer at a side of the gate electrode and includes the gate recess. The first nitride semiconductor layer may include a recess that is disposed at a position overlapping the gate recess in the plan view and is recessed from the gate electrode toward the nitride semiconductor layer With this, the gate recess is formed along a shape of the recess without needing to adjust a film thickness by, for example, etching the second nitride semiconductor layer. It is, therefore, possible to limit, variations in the film thickness of second nitride semiconductor layer and variations in the threshold voltage.

The second nitride semiconductor layer may have, for example, a uniform film thickness along an inner surface of the recess.

This makes it possible to limit variations in the threshold voltage.

The semiconductor device according to an aspect of the present disclosure may further include, for example, a spacer layer disposed between the nitride semiconductor layer and the gate insulator film. The spacer layer may be located between the gate electrode and the source electrode and between the gate electrode and the drain electrode in the plan view.

This enables a region from the gate electrode to the source electrode and the drain electrode in the nitride semiconductor layer to be less susceptible to influence from the threshold value control layer. Accordingly, it is possible to limit a decrease in a carrier density of the region of the nitride semiconductor layer and to decrease an ON resistance.

Note that there is a risk of carriers decreasing in a region, among a channel region of the nitride semiconductor layer, not covered by any of the spacer layer and the gate electrode in a plan view due to an annealing treatment during the manufacturing process.

In contrast, a portion of the spacer layer may, for example, overlap the gate electrode in the plan view.

This makes it possible to limit a decrease in the carrier density and decrease the ON resistance since it is possible to reduce the region, among the channel region of the nitride semiconductor layer, not covered by any of the spacer layer and the gate electrode in the plan view.

The gate insulator film, may, for example, not be disposed between the gate electrode and the source electrode and between the gate electrode and the drain electrode in the plan view.

This enables the region from the gate electrode to the source electrode and the drain electrode in the nitride semiconductor layer to be less susceptible to influence from the threshold value control layer. Accordingly, it is possible to limit a decrease in the carrier density of the region of the nitride semiconductor layer and to decrease the ON resistance.

Hereinafter, embodiments will be concretely described with reference to the drawings.

Note that each of the embodiments described below shows a comprehensive or specific example in the present disclosure. Numerical values, shapes, materials, components, placement and connection of the components, steps and their order, and the like are mere examples and are not intended to limit the present disclosure. Components in the following embodiments not mentioned in any of the independent claims are described as optional elements.

The drawings are schematic diagrams and do not necessarily provide strictly accurate illustrations. For example, the scales and the like in the drawings do, therefore, not necessarily coincide. In the drawings, components that are substantially the same as components described previous thereto have the same reference numerals and overlapping descriptions are omitted or simplified.

In the present specification, terminology indicating the relationship between elements, such as "equal", and terminology indicating the shape of an element, such as "rectangle", do not only refer to their exact meanings, but include a range of relationships between elements and shapes that are essentially the same.

In the present specification, the terms "above" and "below" do not respectively indicate an upward direction (vertically above) and a downward direction (vertically below) defined by an absolute spatial perception, but are used as terminology defined by a relative positional relationship based on an stacking order in a stacked configuration. To be specific, "above" corresponds to a stacking direction in which the semiconductor device is stacked with respect to a substrate, and "below" corresponds to an opposite direction. The terms "above" and "below" are used not only when two components are disposed spaced apart from each other and another component is present between the two components, but also when two components are disposed in close contact with each other and actually contact each other.

In the present specification, the term "in a plan view" refers to when viewed in a thickness direction of the substrate. The thickness direction of the substrate corresponds to the stacking direction (growth direction) of each layer.

In the present specification, AlGaN expresses a ternary mixed crystal of $Al_xGa_{1-x}N$ (where $0 \leq x \leq 1$). For example, the same applies to any other polyadic mixed crystal, e.g. InGaN.

Embodiment 1

Configuration

Figure 1:
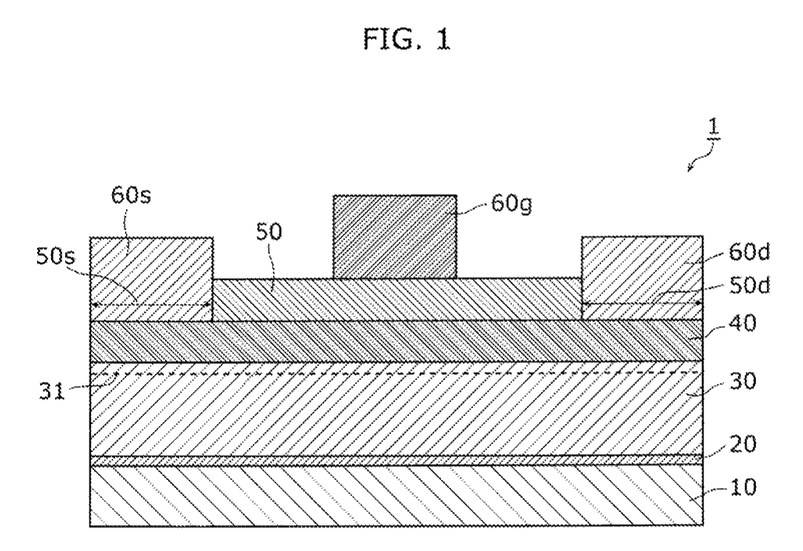
FIG. 1 is a cross-sectional view of a configuration of a semiconductor device according to Embodiment 1.

A configuration of a semiconductor device 1 according to Embodiment 1 will be described first with reference to FIG. 1. FIG. 1 is a cross-sectional view of the configuration of the semiconductor device 1 according to the present embodiment.

The semiconductor device 1 includes a metal-insulator-semiconductor (MIS) structure that includes a nitride semiconductor layer (to be specific, a channel layer 30 and a barrier layer 40), a gate insulator film 50, and a gate electrode 60g stacked in stated order, and is a field-effect transistor (FET) including a source electrode 60s and a drain electrode 60d. In the present embodiment, a top surface of the barrier layer 40 is a flat planer-type HFET.

The semiconductor device 1 according to the present embodiment is a FET with a horizontal structure. To be specific, the source electrode 60s and the drain electrode 60d are disposed to sandwich the gate electrode 60g in a plan view. In other words, the source electrode 60s, the drain electrode 60d, and the gate electrode 60g are disposed at the same side of a substrate 10 (to be specific, the side at which the semiconductor layer is disposed).

To be specific, as illustrated in FIG. 1, the semiconductor device 1 includes the substrate 10, a buffer layer 20, the channel layer 30, the barrier layer 40, the gate insulator film 50, the gate electrode 60g, the source electrode 60s, and the drain electrode 60d. Hereinafter, each component included in the semiconductor device 1 will be described in detail.

The substrate 10 is, for example, rectangular in a plan view and a flat plate with a uniform thickness. The substrate 10 includes, for example, silicon carbide (SiC), sapphire, silicon (Si), or gallium nitride (GaN). Note that as long as it is possible to deposit a nitride semiconductor film such as the channel layer 30 and the barrier layer 40 on the substrate 10, a size, shape, material, etc. of the substrate 10 are not particularly limited. To give an example, the substrate 10 is a Si substrate having a thickness of 650 μm.

The buffer (shock-absorbing) layer 20 is for suitably performing an epitaxial growth of the nitride semiconductor.

To be specific, the buffer layer 20 has a single-layer or multi-layer structure with a nitride semiconductor that includes at least one of AlN, AlGaN, GaN, and InGaN.

The buffer layer 20 is formed through an epitaxial growth method such as metalorganic chemical vapor deposition (MOCVD) or molecular-beam epitaxy (MBE). To give an example, the buffer layer 20 is an AlN film having a thickness of at most 300 nm.

The channel layer 30 is a portion of the nitride semiconductor layer included in the MIS structure. In the present embodiment, the channel layer 30 is disposed on the buffer layer 20 and functions as an electron transport layer.

To be specific, the channel layer 30 is an AlN film grown on the buffer layer 20. The channel layer 30 is formed through an epitaxial growth method such as MOCVD, similar to the buffer layer 20, The channel layer 30 has, for example, a uniform film thickness. To give an example, the channel layer 30 is a GaN film having a thickness of at most 500 nm.

The barrier layer 40 is a portion of the nitride semiconductor layer included in the MIS structure. In the present embodiment, the barrier layer 40 is disposed on the channel layer 30 and functions as an electron-supply layer. Note that in the present embodiment, the nitride semiconductor layer included in the MIS structure has a stacked structure of the channel layer 30 and the barrier layer 40.

To be specific, the barrier layer 40 is an AlGaN film grown on the channel layer 30. The barrier layer 40 is formed through an epitaxial growth method such as MOCVD, similar to the channel layer 30. The barrier layer 40 has, for example, a uniform film thickness. To give an example, the barrier layer 40 is an AlGaN film having a thickness of at most 50 nm.

The barrier layer 40 has a larger band gap than the channel layer 30. Two-dimension electron gas (2DEG) 31 is induced by spontaneous polarization and piezoelectric polarization around an interface between the barrier layer 40 and the channel layer 30, which have different band gaps, due to the barrier layer 40 and the channel layer 30 contacting each other. The 2DEG 31 is formed at the interface between the barrier layer 40 and the channel layer 30 at the side of the channel layer 30 with a thickness of at most 10 nm. Note that in FIG. 1, the 2DEG 31 is illustrated simplified with a dashed line. The 2DEG 31 functions as a channel of the semiconductor device 1.

In the present embodiment, the buffer layer 20, the channel layer 30, and the barrier layer 40 are successively deposited through an epitaxial growth method. By changing deposition conditions of each layer (type of organic metal material, amount of gas to be supplied, deposition time, etc.), the buffer layer 20, the channel layer 30, and the barrier layer 40 are deposited with a film thickness and composition ratio tailored to each layer. The substrate 10, the buffer layer 20, the channel layer 30, and the barrier layer 40 are also referred to collectively as an epitaxial growth substrate.

The gate insulator film 50 has an MIS structure. In the present embodiment, the gate insulator film 50 is disposed on the barrier layer 40 as to cover an entire area of the barrier layer 40. Note that the entire area is, to be specific, an entire element area that is an area in which semiconductor device 1 is formed, and is not necessarily an entire area of the substrate 10.

The gate insulator film 50 includes a threshold value control layer that includes an oxynitride film. In the present embodiment, an entirety of the gate insulator film 50 is the threshold value control layer. A thickness of the gate insulator film 50 is, for example, at least 10 nm and at most 100 nm. It is possible to ensure insulating properties of the gate insulator film 50 due to the thickness of the gate insulator film 50 being at least 10 nm. This makes it possible to limit the gate leakage current and increase the reliability of the semiconductor device 1. It is possible to maintain gate controllability due to the thickness of the gate insulator film 50 being at most 100 nm since the gate electrode 60g is not too far away from the barrier layer 40.

The gate insulator film 50 (i.e., the threshold value control layer) is a oxynitride film containing aluminum (Al). In other words, the gate insulator film 50 includes AlON. The AlON film is, for example, amorphous or microcrystalline. A nitrogen composition ratio of the gate insulator film 50 is, for example, at least 3 at. % and at most 25 at. %, but may also be at least 3 at. % and at most 12 at. %. This makes it possible to obtain a threshold voltage of at least 1.5 V, which is a preferable value for use in power devices. This will be described in detail later with reference to FIG. 3 to FIG. 5.

The AlON film is, for example, deposited with a uniform thickness through atomic layer deposition (ALD), sputtering, or the like. To give an example, the gate insulator film 50 is, for example, an AlON film having a thickness of at most 30 nm. Note that it is possible to limit the gate leakage current by performing a heating treatment after the AlON film is formed (post-deposition annealing). Note that a temperature of the heating treatment is, for example, at least 500° C. and at most 900° C.

As illustrated in FIG. 1, electrode disposition regions 50s and 50d are formed at the gate insulator film 50 so that the source electrode 60s and the drain electrode 60d contact the barrier layer 40. Note that in FIG. 1, ranges of the electrode disposition regions 50s and 50d are shown illustrated with double-headed arrows.

The electrode disposition regions 50s and 50d are spaces or contact holes in which a portion of the gate insulator film 50 is removed and a portion of the barrier layer 40 is exposed. To be specific, the electrode disposition regions 50s and 50d are formed by removing the portion of the gate insulator film 50 through etching after forming a resist pattern on the gate insulator film 50, which is formed on the entire area, through photolithography, and stripping off the resist pattern.

The source electrode 60s and the drain electrode 60d are electrically conductive ohmic electrodes that contact the barrier layer 40. To be specific, the source electrode 60s and the drain electrode 60d are respectively disposed at the electrode disposition regions 50s and 50d, and are in ohmic contact with the barrier layer 40. The source electrode 60s and the drain electrode 60d are disposed to sandwich the gate electrode 60g in the plan view. Film thicknesses of the source electrode 60s and the drain electrode 60d are, for example, at most 240 nm, but are not limited thereto.

The source electrode 60s and the drain electrode 60d are formed using an electrically conductive metallic material. To be specific, the source electrode 60s and the drain electrode 60d have a single-layer or multi-layer structure. Each layer in the source electrode 60s and the drain electrode 60d includes at least one metal or an alloy of at least two metals selected from titanium (Ti), aluminum (Al), molybdenum (Mo), and hafnium (Hf). Note that the source electrode 60s and the drain electrode 60d are formed using the same material, but may also be formed using different materials.

The source electrode 60s and the drain electrode 60d are formed through patterning after depositing the metallic material. For example, after depositing a metallic film having a uniform thickness through vapor deposition, sputtering, or the like, the resist pattern is formed through photolithography and the like. The source electrode 60s and the drain electrode 60d are formed by removing a portion of the metallic film through etching and stripping off the resist pattern. Alternatively, the metallic film may be formed through vapor deposition, sputtering, or the like after the resist pattern is formed through photolithography and the like, and the resist pattern may be stripped off and the portion of the metallic film may be removed through a lift-off method. A heating treatment (annealing) may be performed on the source electrode 60s and the drain electrode 60d after the patterning.

The gate electrode 60g is a metallic layer having an MIS structure. The gate electrode 60g is disposed on the gate insulator film 50. To be specific, the gate electrode 60g contacts and covers a predetermined region of a top surface of the gate insulator film 50 (gate electrode disposition region). A film thickness of the gate electrode 60g is, for example, at most 320 nm, but is not limited thereto.

The gate electrode 60g is formed using an electrically conductive metallic material. To be specific, the gate electrode 60g has a single-layer or multi-layer structure. Each layer in the gate electrode 60g includes at least one metal or an alloy of at least two metals selected from titanium (Ti), aluminum (Al), tungsten (W), nickel (Ni), and gold (Au).

The gate electrode 60g is formed through patterning after depositing the metallic material. For example, after depositing a metallic film having a uniform thickness through vapor deposition, sputtering, or the like, a resist pattern is formed through photolithography and the like. The gate electrode 60g is formed by removing a portion of the metallic film through etching and stripping off the resist pattern. Alternatively, the metallic film may be formed through vapor deposition, sputtering, or the like after the resist pattern is formed through photolithography and the like, and the resist pattern may be stripped off and the portion of the metallic film may be removed through a lift-off method. A heating treatment (annealing) may be performed on the gate electrode 60g after the patterning.

Note that the nitrogen composition ratio of the gate insulator film 50 does not have to be uniform in a thickness direction. To be specific, a nitrogen content of the gate insulator film 50 may have a gradient in the thickness direction. More specifically, a nitrogen content in the gate insulator film 50 may decrease from the barrier layer 40 toward the gate electrode 60g. The nitrogen content may decrease continuously and may also decrease discretely. For example, a nitrogen composition ratio of the gate insulator film 50 is 7 at. % around an interface between a threshold value control layer 152 and the barrier layer 40, and 3 at. % around an interface between the threshold value control layer 152 and the gate electrode 60g, but is not limited thereto.

It is possible to increase insulating properties of a region of the gate insulator film 50 close to the gate electrode 60g due to a nitrogen content of the region being low. It is, therefore, possible to limit the gate leakage current. It is possible to increase threshold value controllability due to a nitrogen content of a region of the gate insulator film 50 close to the barrier layer 40 being high.

Variation

Figure 2:
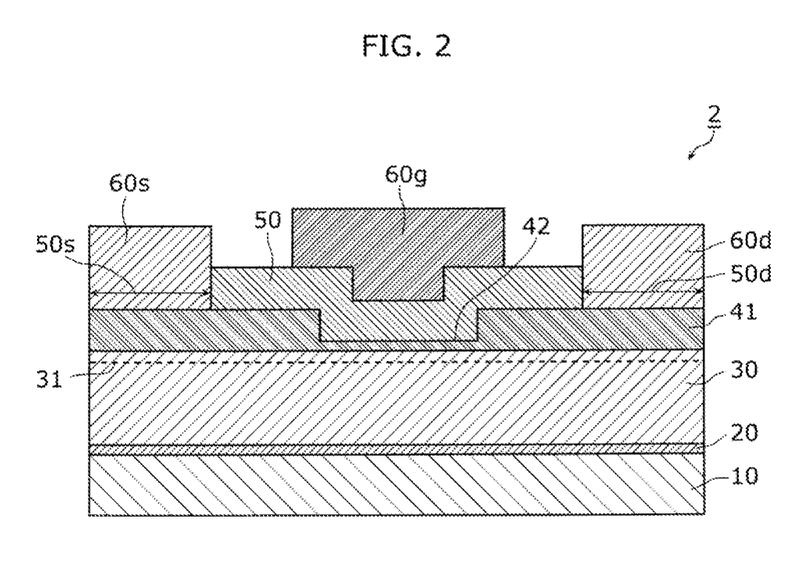
FIG. 2 is a cross-sectional view of a configuration of another semiconductor device according to Embodiment 1.

A variation of the semiconductor device according to the present embodiment will be described next with reference to FIG. 2. FIG. 2 is a cross-sectional view of a configuration of a semiconductor device 2 according to the present variation.

In the semiconductor device 2 according to the present variation, a gate recess 42 is disposed in the nitride semiconductor layer. In other words, the semiconductor device 2 has a gate-recess structure.

To be specific, as illustrated in FIG. 2, the semiconductor device 2 differs from the semiconductor device 1 shown in FIG. 1 in that the semiconductor device 2 includes a barrier layer 41 in which the gate recess 42 is disposed instead of the barrier layer 40. Hereinafter, differences from the semiconductor device 1 shown in FIG. 1 will mainly be described and overlapping descriptions will be omitted or simplified.

The barrier layer 41 differs from the barrier layer 40 in that the barrier layer 41 includes the gate recess 42. The gate recess 42 is a recess that is recessed from a top surface of the barrier layer 41 (surface at the side of the gate electrode 60g) toward the substrate 10. In other words, a surface of the barrier layer 41 close to the gate electrode 60g is curved in a concave shape to form the gate recess 42.

The gate recess 42 is disposed in a position overlapping the gate electrode 60g in the plan view. In other words, the gate recess 42 is located directly beneath the gate electrode 60g. Note that a film thickness of the barrier layer 41 remaining directly beneath the gate recess 42 is, for example, 5 nm, but is not limited thereto.

FIG. 2 shows an example of an angle between a bottom surface and a lateral surface of the gate recess 42 being 90°, but is not limited thereto. The lateral surface of the gate recess 42 may also slope with respect to the bottom surface. The angle between the lateral surface and the bottom surface of the gate recess 42 is, for example, within 90°±10°. With this, it is easier for the lateral surface to be apolar.

The gate recess 42 is formed, for example, by depositing an AlGaN film, which forms the barrier layer 41, having a uniform thickness and then removing the AlGaN film from a top surface up to a predetermined depth at the gate electrode disposition region. Ta be specific, the AlGaN film is removed up to the predetermined depth through etching after forming a resist pattern on the top surface of the AlGaN film through photolithography and the like. Subsequently, the barrier layer 41 in which the gate recess 42 is disposed is formed by stripping off the resist pattern.

Note that in the present variation, the gate insulator film 50 is disposed along the bottom surface and the lateral surface of the gate recess 42 as to cover the surface of the gate recess 42. The gate insulator film 50 has a uniform thickness above the bottom surface of the gate recess 42. In other words, the recess that is recessed toward the substrate 10 is formed by disposing the gate recess 42 in the top surface of the gate insulator film 50. The gate electrode 60g covers the recess.

In the semiconductor device 2 according to the present variation, the film thickness of the barrier layer 41 remaining directly beneath the gate electrode 60g is smaller than in the semiconductor device 1 shown in FIG. 1 due to the gate recess 42 being disposed. Accordingly, it is possible to reduce 2DEG induced by polarization directly beneath the gate electrode 60g and to shift the threshold voltage to a positive side.

Nitrogen Composition Ratio

Subsequently, a relationship between (i) the nitrogen composition ratio of the gate insulator film (threshold value control layer) 50 in the semiconductor devices 1 and 2, and (ii) device properties of the semiconductor devices 1 and 2 will be described. The inventors have tested five types of samples and assessed properties thereof, the five types of samples having the same configuration as the semiconductor device 2 shown in FIG. 2 and the gate insulator film 50 each having a different nitrogen composition ratio.

Note that the AlON film, which forms the gate insulator film 50, is formed through sputtering while being supplied with a mixed gas of oxygen ($O_2$) and nitrogen ($N_2$) using a sputtering target including aluminum. The nitrogen composition ratio of the gate insulator film (threshold value control layer) 50 differs for each sample by adjusting a ratio of introduced gas in the sputtering. To be specific, an AlON film with a high nitrogen composition ratio is formed by increasing a ratio of nitrogen gas included in the mixed gas. An AlON film with a low nitrogen composition ratio is formed by decreasing the ratio of nitrogen gas included in the mixed gas.

The nitrogen composition ratio in the AlON film of the tested samples was analyzed using X-ray photoelectron spectroscopy (XPS). The conditions of the analysis are as follows.

Measuring device: QuanteraSXM manufactured by ULVAC PHI

X-ray source: monochromatic Al (1486.6 eV)

Detection region: 50 μmφ

Detection depth: approx. 4-5 nm (extraction angle of 45°)

Measurement spectrum: Al2p, O1s, N1s, C1s, Ga2p3/2, Si2s

Sputter conditions: Ar+2.0 kV

Sputter rate: approx. 5 nm/min (reduced value of $SiO_2$).

The nitrogen composition ratio of the NON film is determined depending on an area ratio of the spectrum of Al2p, O1s, and N1s taking into consideration a sensitivity coefficient. The inventors have confirmed that by increasing the nitrogen composition ratio, only a spectral intensity of the element O decreases without a spectral intensity of the element Al changing. In other words, it can be assumed that an increase in the nitrogen composition ratio leads to a portion of the AlO being replaced with AlN.

In the five types of samples that the inventors have tested, the nitrogen composition ratios of the AlON forming the gate insulator film 50 were, respectively, 3 at. %, 7 at. %, 12 at. %, 15 at. %, and 25 at. %. Hereinafter, an assessment result of each sample will be described with reference to FIG. 3 to FIG. 5. An assessment result of a sample not including nitrogen will also be illustrated in each drawing as reference.

Figure 3:
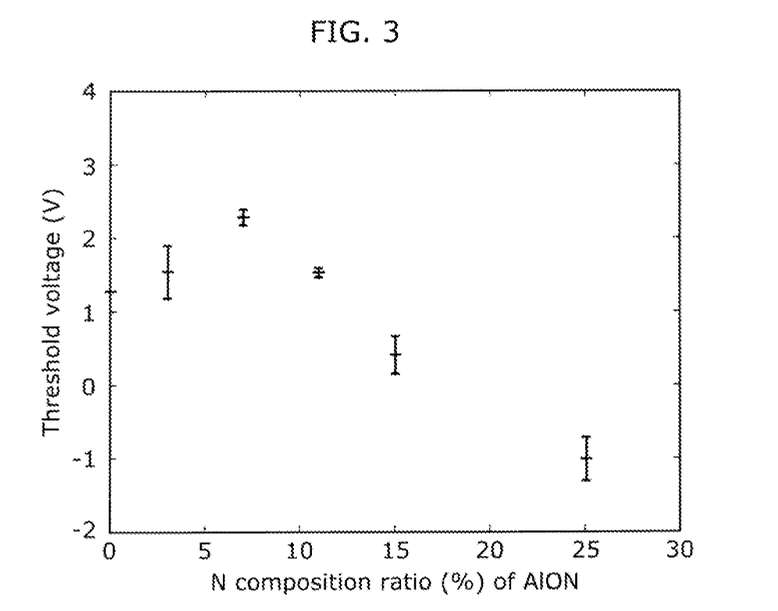
FIG. 3 is a diagram showing a relationship between a nitrogen composition ratio of a threshold value control layer and a threshold voltage in the semiconductor device according to Embodiment 1.

FIG. 3 is a diagram showing a relationship between the nitrogen composition ratio of the gate insulator film (threshold value control layer) 50 and the threshold voltage in the semiconductor device 2 according to the present embodiment. In FIG. 3, the horizontal axis is nitrogen composition ratio (%) and the vertical axis is threshold voltage (V).

Note that in each of the five types of samples, multiple semiconductor devices 2 are arranged on the substrate 10 in the plan view. In FIG. 3, the threshold voltage of each of the multiple semiconductor devices 2 is measured, and an average, a minimum value, and a maximum value thereof are shown for each sample.

As illustrated in FIG. 3, in the samples with a nitrogen composition ratio of 3 at. %, 7 at. %, and 12 at. %, each threshold voltage (average value) was approximately 1.5 V or more. In the sample with a nitrogen composition ratio of 15 at. %, the threshold voltage was also greater than 0 V. In the sample with a nitrogen composition ratio of 25 at. %, the threshold voltage was approximately −1 V.

It can be understood from the graph shown in FIG. 3 that the threshold voltage decreases with an increase in the nitrogen composition ratio with the threshold voltage peaking when the nitrogen composition ratio is around 7 at. %. To be specific, the threshold voltage monotonically decreases with respect to the nitrogen composition ratio when the nitrogen composition ratio is in a range of at least 7 at. % and at most 25 at. %. More specifically, the threshold voltage and the nitrogen composition ratio have a negative proportional relationship (proportionality coefficient is a negative number) in the range of at least 7 at. % and at most 25 at. %.

With this, it can be understood that in order to obtain a desired threshold voltage, the threshold value may be a value corresponding to the nitrogen composition ratio. Since the threshold voltage and the nitrogen composition ratio have a negative proportional relationship, it is possible to easily realize a desired threshold voltage. Favorable threshold value controllability is realized when the nitrogen composition ratio is in the range of at least 3 at. % and at most 25 at. %.

Figure 4:
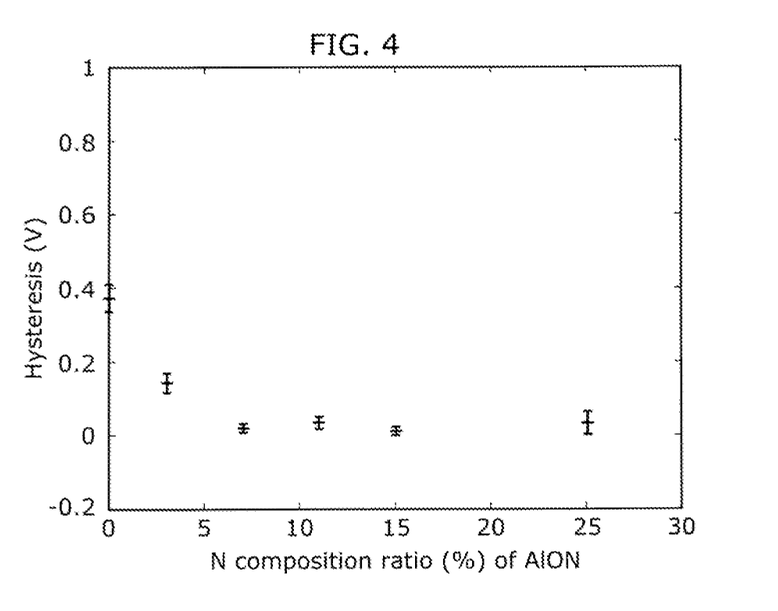
FIG. 4 is a diagram showing a relationship between the nitrogen composition ratio of the threshold value control layer and hysteresis in the semiconductor device according to Embodiment 1.

FIG. 4 is a diagram showing a relationship between the nitrogen composition ratio of the gate insulator film (threshold value control layer) 50 and the hysteresis in the semiconductor device 2 according to the present embodiment. In FIG. 4, the horizontal axis is nitrogen composition ratio (%) and the vertical axis is hysteresis (V).

The hysteresis corresponds to a difference of a return threshold voltage when the voltage applied to the gate electrode 60g is swept. Since a fluctuation in the threshold voltage when an applied voltage increases or decreases becomes smaller with a decrease in the hysteresis, the semiconductor device is highly reliable.

As illustrated in FIG. 4, in the sample not including nitrogen (nitrogen composition ratio of 0%), the hysteresis is approximately 0.35 V. In contrast, in the sample with a nitrogen composition ratio of 3 at. %, the hysteresis is approximately 0.15 V. In other words, in the sample with a nitrogen composition ratio of 3 at. %, it is possible to limit the hysteresis to at most half of the hysteresis in the sample not including nitrogen.

As illustrated in FIG. 4, the hysteresis is approximately 0 V in the samples with a nitrogen composition ratio of 7 at. %, 12 at. %, 15 at. %, and 25 at. %. In other words, it can be understood that the hysteresis is limited sufficiently without the hysteresis increasing even when the nitrogen composition ratio is increased.

This makes it possible to realize a desired threshold voltage while limiting an increase in the hysteresis by adjusting the nitrogen composition ratio.

Figure 5:
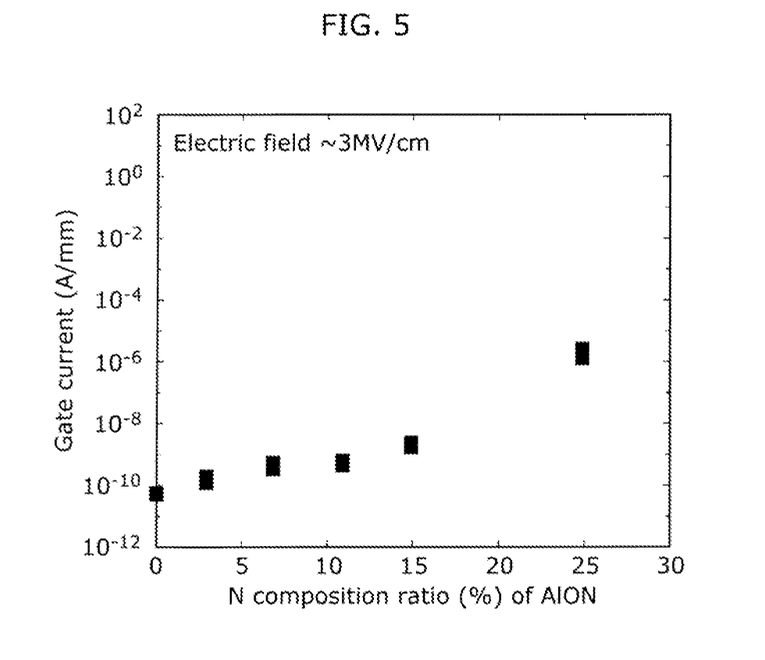
FIG. 5 is a diagram showing a relationship between the nitrogen composition ratio of the threshold value control layer and a gate current in the semiconductor device according to Embodiment 1.

FIG. 5 is a diagram showing a relationship between the nitrogen composition ratio of the gate insulator film (threshold value control layer) 50 and the gate current in the semiconductor device 2 according to the present embodiment. In FIG. 5, the horizontal axis is nitrogen composition ratio (%), the vertical axis is gate current (leakage current) (A/mm) when an electric field of 3MV/cm is applied to the gate insulator film 50.

As illustrated in FIG. 5, it can be understood that the gate current increases with an increase in the nitrogen composition ratio. To be specific, in the sample with a nitrogen composition ratio of 15 at. %, the gate current is approximately $10^{-9}$ A/mm. In contrast, in the sample with a nitrogen composition ratio of 25 at. %, the gate current is approximately $10^{-6}$ A/mm.

Accordingly, it can be understood that in order to ensure favorable insulating properties, the nitrogen composition ratio is at most 25 at. % and preferably at most 15 at. %.

Note that a verification result of the properties of the semiconductor device 2 having a gate-recess structure has been described with reference to FIG. 3 to FIG. 5, but the same applies to the properties of the semiconductor device 1 shown in FIG. 1. Therefore, the semiconductor device 1 or 2 according to the present embodiment makes it possible to change the threshold voltage of the semiconductor device 1 or 2 to a suitable value by adjusting the nitrogen composition ratio of the AlON to a suitable value since the gate insulator film 50 includes the threshold value control layer including AlON. As such, the present embodiment makes it possible to provide the semiconductor device 1 or 2 having a desired threshold voltage.

Embodiment 2

Subsequently, Embodiment 2 will be described.

Figure 6:
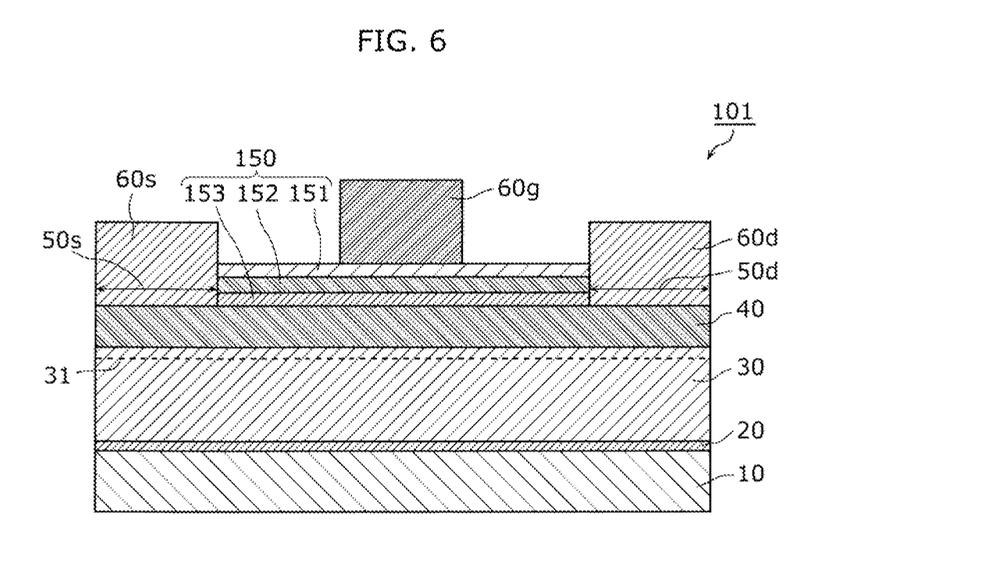
FIG. 6 is a cross-sectional view of a configuration of a semiconductor device according to Embodiment 2.

FIG. 6 is a cross-sectional view of a configuration of a semiconductor device 101 according to the present embodiment. As illustrated in FIG. 6, the semiconductor 101 according to the present embodiment differs from the semiconductor device 1 according to Embodiment 1 in that the semiconductor 101 includes a gate insulator film 150 instead of the gate insulator film 50. Hereinafter, differences from Embodiment 1 will mainly be described and overlapping descriptions will be omitted or simplified.

As illustrated in FIG. 6, the gate insulator film 150 includes a first insulation layer 151, the threshold value control layer 152, and a second insulation layer 153. In other words, in the present embodiment, the gate insulator film 150 has a multi-layer structure including the threshold value control layer 152.

The threshold value control layer 152 includes an oxynitride film similar to the gate insulator film 50 according to Embodiment 1. To be specific, the threshold value control layer 152 is an AlON film. The nitrogen composition ratio of the threshold value control layer 152 is, for example, at least 3 at. % and at most 25 at. %, but may also be at least 7 at. % and at most 15 at. %.

A nitrogen composition ratio of the threshold value control layer 152 does not have to be uniform in the thickness direction. To be specific, a nitrogen content of the threshold value control layer 152 may have a gradient in the thickness direction. More specifically, a nitrogen content in the threshold value control layer 152 decreases from the barrier layer 40 (the nitride semiconductor layer) toward the gate electrode 60g. The nitrogen content may decrease continuously (smoothly) and may also decrease discretely (gradually). For example, the nitrogen composition ratio of the threshold value control layer 152 is 7 at. % around an interface between the threshold value control layer 152 and the second insulation layer 153 close to the barrier layer 40, and 3 at. % around an interface between the threshold value control layer 152 and the first insulation layer 151 close to the gate electrode 60g, but is not limited thereto.

It is possible to increase insulating properties of a region of the threshold value control layer 152 close to the gate electrode 60g due to a nitrogen content of the region being low. It is, therefore, possible to limit the gate leakage current. It is possible to increase threshold value controllability due to a nitrogen content of a region of the threshold value control layer 152 close to the barrier layer 40 being high.

The first insulation layer 151 is stacked on the threshold value control layer 152 at the side of the gate electrode 60g. The first insulation layer 151 includes at least one of an oxide film, a nitride film, or an oxynitride film. To be specific, the first insulation layer 151 is disposed on the threshold value control layer 152 as to cover an entire area of a top surface of the threshold value control layer 152. Note that the gate electrode 60g is disposed on the first insulation layer 151.

The first insulation layer 151 includes, for example, a material with a high dielectric constant or high insulating properties. The material with a high dielectric constant is, to be specific, titanium oxide ($TiO_2$), tantalum oxide (TaO), hafnium oxide ($HfO_2$), or the like. The material with high insulating properties is, to be specific, aluminum oxide ($Al_2O_3$), silicon oxide ($SiO_2$), or the like.

The second insulation layer 153 is stacked on the threshold value control layer 152 at the side of the barrier layer 40. The second insulation layer 153 includes at least one of an oxide film, a nitride film, or an oxynitride film. To be specific, the second insulation layer 153 contacts the threshold value control layer 152 as to cover an entire area of a bottom surface of the threshold value control layer 152. In other words, the threshold value control layer 152 is disposed on the second insulation layer 153 as to cover an entire area of a top surface of the second insulation layer 153. The second insulation layer 153 includes, for example, a material with a high dielectric constant or high insulating properties.

A thickness of the gate insulator film 150 is, for example, at least 10 nm and at most 100 nm. Film thicknesses of individual layers forming the gate insulator film 150 are, for example, equal to each other, but are not limited thereto. The film thickness of the threshold value control layer 152 may be, for example, greater than the film thicknesses of the first insulation layer 151 and the second insulation layer 153.

It is possible to ensure the insulating properties of the gate insulator film 150 due to the thickness of the gate insulator film 150 being at least 10 nm. It is possible to increase the reliability of the semiconductor 101. It is also possible to maintain gate controllability due to the thickness of the gate insulator film 150 being at most 100 nm since the gate electrode 60g is not too far away from the barrier layer 40.

In the present embodiment, it is possible to change the threshold voltage of the semiconductor 101 to a desired voltage by adjusting the nitrogen composition ratio, similar to Embodiment 1, since the gate insulator film 50 includes the threshold value control layer 152.

Figure 7:
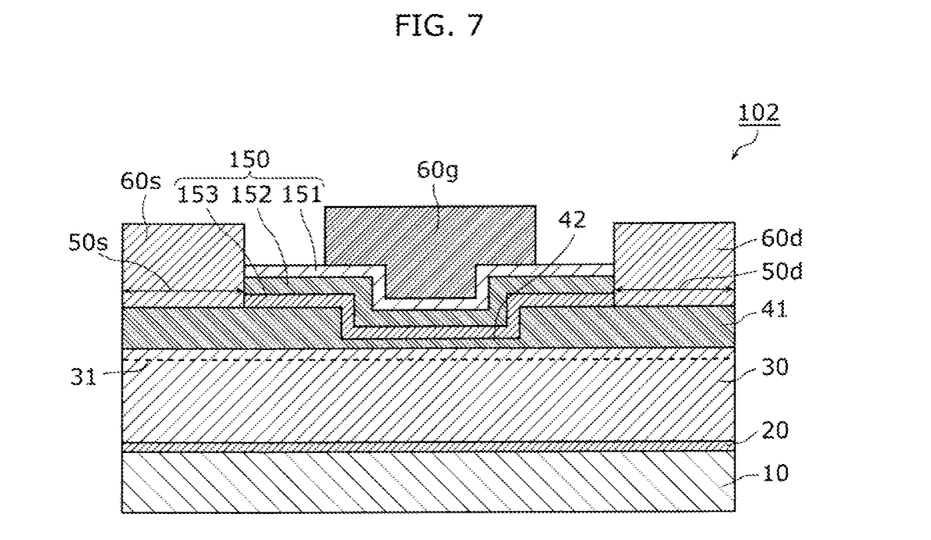
FIG. 7 is a cross-sectional view of a configuration of another semiconductor device according to Embodiment 2.

Note that the semiconductor 101 according to the present embodiment may have a gate-recess structure, similar to the variation according to Embodiment 1. FIG. 7 is a cross-sectional view of a configuration of a semiconductor device 102 according to a variation of the present embodiment.

As illustrated in FIG. 7, the semiconductor device 102 differs from the semiconductor 101 shown in FIG. 6 in that the semiconductor device 102 includes the barrier layer 41 in which the gate recess 42 is disposed instead of the barrier layer 40. As illustrated in FIG. 7, the gate insulator film 150 having a three-layer structure has a concave shape along the bottom surface and the lateral surface of the gate recess 42, similar to the variation of Embodiment 1.

This makes it possible to not only produce the same advantageous effects as the semiconductor 101 according to Embodiment 2, but also shift the threshold voltage to the positive side, similar to the semiconductor device 2 according to the variation of Embodiment 1.

Note that in the present embodiment, the gate insulator film 150 has a three-layer structure of the second insulation layer 153, the threshold value control layer 152, and the first insulation layer 151 stacked in stated order from the side of the barrier layer 40. For example, the second insulation layer 153 is formed using a material with a high dielectric constant, and the first insulation layer 151 is formed using a material with high insulating properties. This makes it possible to increase threshold value controllability since the second insulation layer 153 formed using a material with a high dielectric constant and the threshold value control layer 152 are disposed close to the barrier layer 40. It is also possible to limit the gate leakage current by providing the first insulation layer 151 formed using a material with high insulating properties.

The three-layer structure of the gate insulator film 150 may also be a stacked structure of the threshold value control layer 152, the second insulation layer 153, and the first insulation layer 151 stacked in stated order from the side of the barrier layer 40. This makes it possible to increase the threshold value controllability since the threshold value control layer 152 is disposed close to the barrier layer 40.

In the present embodiment and the variation thereof, an example is shown of the gate insulator film 150 having a three-layer structure including the first insulation layer 151, the threshold value control layer 152, and the second insulation layer 153, but the gate insulator film 150 is not limited thereto. The gate insulator film 150 may also not include the first insulation layer 151 or the second insulation layer 153. To be specific, the gate insulator film 150 may have a two-layer structure including the first insulation layer 151 and the threshold value control layer 152, and may also have a two-layer structure including the threshold value control layer 152 and the second insulation layer 153.

In the present embodiment and the variation thereof, an example is shown of the nitrogen content of the threshold value control layer 152 having a gradient in the thickness direction, but the nitrogen content of the threshold value control layer 152 may also be uniform in the thickness direction. When the gate insulator film 50 of Embodiment 1 and the like has a single-layer structure with the threshold value control layer, the nitrogen content may have a gradient in a depth direction.

Embodiment 3

Subsequently, Embodiment 3 will be described.

Figure 8:
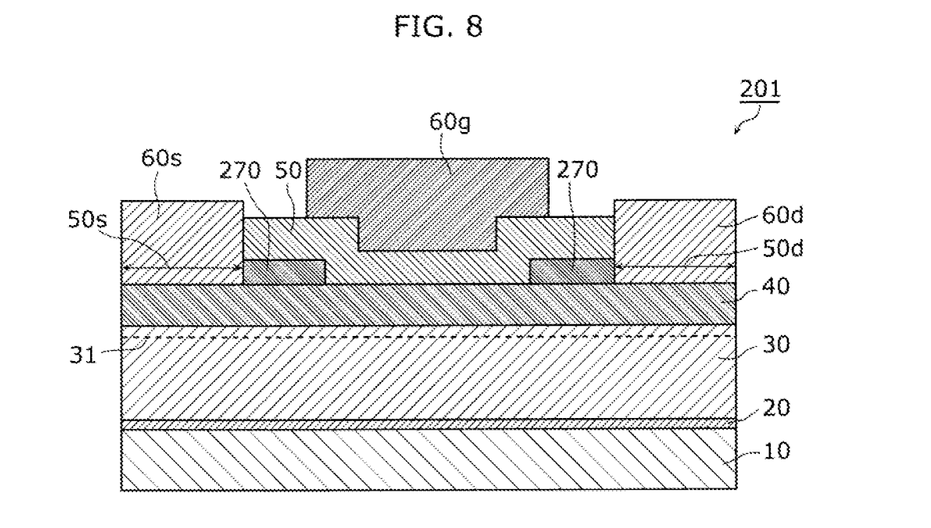
FIG. 8 is a cross-sectional view of a configuration of a semiconductor device according to Embodiment 3.

FIG. 8 is a cross-sectional view of a configuration of a semiconductor device 201 according to the present embodiment. As illustrated in FIG. 8, the semiconductor device 201 differs from the semiconductor device 1 shown in FIG. 1 in that the semiconductor device 201 further includes a spacer layer 270. Hereinafter, differences from Embodiment 1 will mainly be described and overlapping descriptions will be omitted or simplified.

As illustrated in FIG. 8, the spacer layer 270 is disposed between the barrier layer 40 and the gate insulator film 50. The spacer layer 270 is located between the gate electrode 60g and the source electrode 60s and between the gate electrode 60g and the drain electrode 60d in the plan view. For example, the spacer layer 270 extends from the source electrode 60s and the drain electrode 60d toward the gate electrode 60g, and is disposed on the barrier layer 40. The spacer layer 270, for example, contacts the source electrode 60s and the drain electrode 60d.

The spacer layer 270 is formed using a material with insulating properties. The spacer layer 270 is formed using aluminum oxide, silicon oxide, or the like. A film thickness of the spacer layer 270 is, for example, smaller than the thickness of the gate insulator film 50.

The semiconductor device 201 according to the present embodiment makes it possible to limit a decrease in the carriers of the 2DEG 31 directly beneath the spacer layer 270 by providing the spacer layer 270. It is possible to limit a decrease in the ON resistance by limiting a decrease in the carriers of the 2DEG 31.

A portion of the spacer layer 270 overlaps the gate electrode 60g in the plan view. In other words, an end portion of the gate electrode 60g covers the portion of the spacer layer 270. To be specific, an end portion of the gate electrode 60g close to the source electrode 60s and an end portion of the gate electrode 60g close to the drain electrode 60d cover the portion of the spacer layer 270.

This enables a region not covered by the spacer layer, among a region between a source and drain of the channel layer 30 (channel region), to be covered by the gate electrode 60g. When an annealing (to be specific, oxygen annealing) treatment is performed during the manufacturing process on the region not covered by the spacer layer 270, among the channel region of the channel layer 30, the carriers decrease and resistance increases. The present embodiment makes it possible to limit a decrease in the carriers during the annealing since it is possible to cover the region not covered by the spacer layer 270 with the gate electrode 60g. This makes it possible to decrease the ON resistance.

Figure 9:
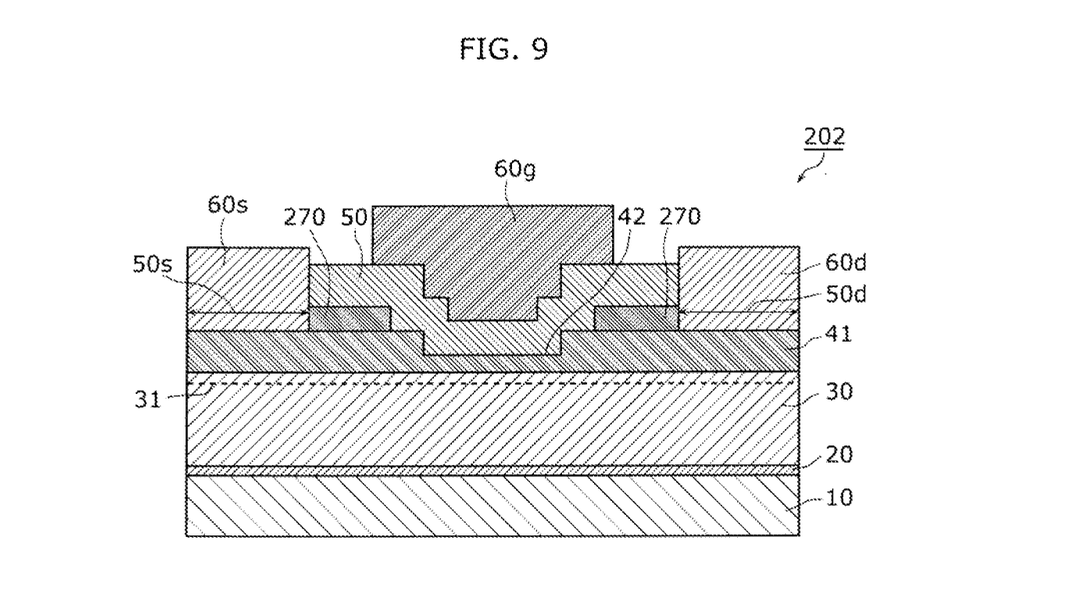
FIG. 9 is a cross-sectional view of a configuration of another semiconductor device according to Embodiment 3.

Note that the semiconductor 201 according to the present embodiment may have a gate-recess structure, similar to the variation according to Embodiment 1. FIG. 9 is a cross-sectional view of a configuration of a semiconductor device 202 according to a venation of the present embodiment.

As illustrated in FIG. 9, the semiconductor device 202 differs from the semiconductor device 201 shown in FIG. 8 in that the semiconductor device 202 includes the barrier layer 41 in which the gate recess 42 is disposed instead of the barrier layer 40.

This makes it possible to not only produce the same advantageous effects as the semiconductor 201 according to Embodiment 3, but also shift the threshold voltage to the positive side, similar to the semiconductor device 2 according to the variation of Embodiment 1.

Note that the gate insulator film 50 may have a three-layer structure or a two-layer structure, similar to Embodiment 2 and the variation thereof.

Figure 10:
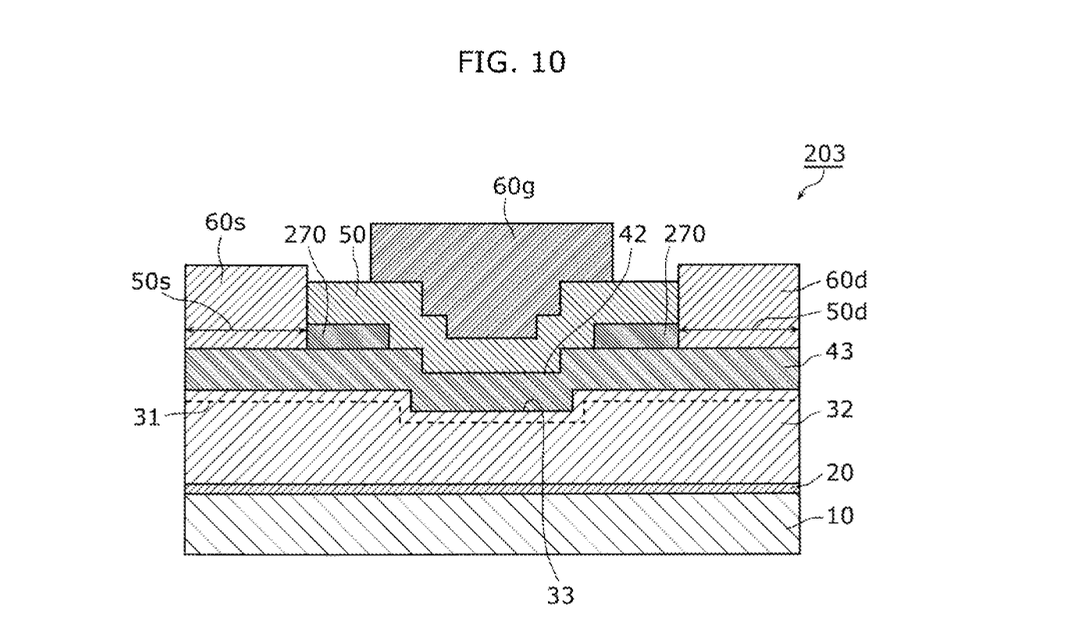
FIG. 10 is a cross-sectional view of a configuration of another semiconductor device according to Embodiment 3.

For example, a recess may be disposed in the channel layer 30 along the shape of the gate recess 42. In other words, the semiconductor 202 may have a trenched structure in which a recess is disposed that extends to the GaN layer directly beneath the gate. FIG. 10 is a cross-sectional view of a configuration of a semiconductor device 203 according to a variation of the present embodiment.

As illustrated in FIG. 10, the semiconductor device 203 differs from the semiconductor device 202 shown in FIG. 9 in that the semiconductor device 203 includes a channel layer 32 and a barrier layer 43 instead of the channel layer 30 and the barrier layer 41.

The channel layer 32 is an example of a first nitride semiconductor layer. A recess 33 is disposed in a top surface of the channel layer 32. The recess 33 is recessed from the gate electrode 60g in the MIS structure toward the nitride semiconductor layer. To be specific, the recess 33 is recessed from a top surface of the channel layer 32 (surface at the side of the gate electrode 60g) toward the substrate 10. The recess 33 is disposed in a position overlapping the gate electrode 60g and the gate recess 42 in the plan view. In other words, the recess 33 is located directly beneath the gate electrode 60g. Note that a depth of the recess 33 is, for example, the same as a depth of the gate recess 42, but is not limited thereto.

FIG. 10 shows an example of an angle between a bottom surface and a lateral surface of the recess 33 being 90°, but is not limited thereto. The lateral surface of the recess 33 may also slope with respect to the bottom surface. The angle between the lateral surface and the bottom surface of the recess 33 is, for example, within 90°±10°.

The recess 33 is formed, for example, by depositing an AlN film, which forms the channel layer 32, having a uniform thickness and then removing the AlN film from a top surface until a predetermined depth at the gate electrode disposition region. To be specific, the AlN film is removed up to the predetermined depth through etching after forming a resist pattern on the top surface of the AlN film through photolithography and the like. Subsequently, the recess 33 is formed by stripping off the resist pattern.

Furthermore, an AlGaN film forming the barrier layer 43 is deposited having a uniform thickness on the top surface of the channel layer 32 including the recess 33. In other words, the barrier layer 43 is formed along an inner surface of the recess 33 with a uniform film thickness. Since the barrier layer 43 is formed along a shape of the recess 33, the gate recess 42 is formed in the top surface of the barrier layer 43. In the present variation, the barrier layer 43 is stacked on the channel layer 32 at the side of the gate electrode 60g, and is an example of a second nitride semiconductor layer including the gate recess 42.

In this manner, it is possible to form the gate recess 42 without having to etch the AlGaN film forming the barrier layer 43. Accordingly, since it is possible to control the film thickness of the barrier layer 43 in a growing process of the AlGaN film, controlling the film thickness of the barrier layer 43 becomes easier. It is, therefore, possible to limit variations in the threshold voltage.

Note that a configuration is shown in which the semiconductor 202 including the spacer layer 270 has a trenched structure (to be specific, the recess 33 in the top surface of the channel layer 32), but the above-mentioned semiconductor device 2 or 102 or a semiconductor device 302 and the like that will be described later may also have a trenched structure.

Embodiment 4

Subsequently, Embodiment 4 will be described.

Figure 11:
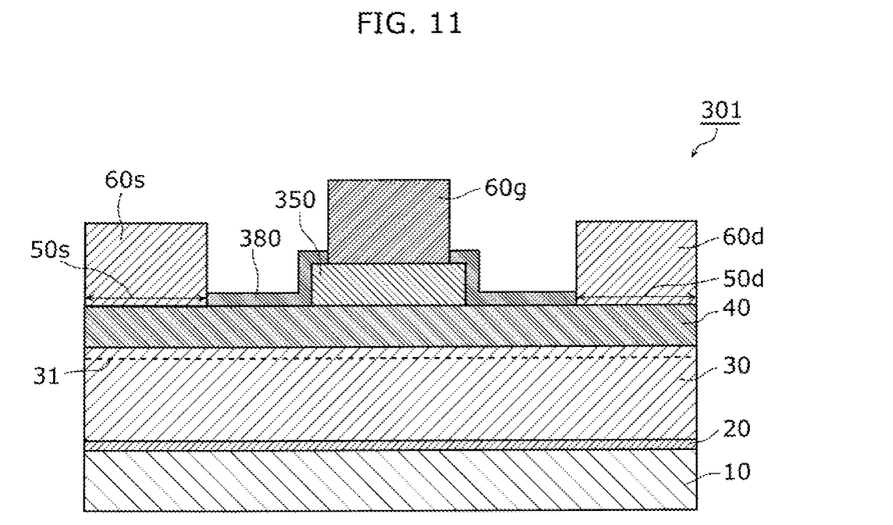
FIG. 11 is a cross-sectional view of a configuration of a semiconductor device according to Embodiment 4.

FIG. 11 is a cross-sectional view of a configuration of a semiconductor device 301 according to the present embodiment. As illustrated in FIG. 11, the semiconductor device 301 differs from the semiconductor device 1 shown in FIG. 1 in that the semiconductor device 301 includes a gate insulator film 350 instead of the gate insulator film 50 and further includes an insulator film 380. Hereinafter, differences from Embodiment 1 will mainly be described and overlapping descriptions will be omitted or simplified.

As illustrated in FIG. 11, the gate insulator film 350 is not disposed in at least a portion between the gate electrode 60g and the source electrode 60s and between the gate electrode 60g and the drain electrode 60d in the plan view. To be specific, the gate insulator film 350 is not disposed in at least a portion of a region between the gate electrode 60g, the source electrode 60s, and the drain electrode 60d. For example, the gate insulator film 350 is located directly beneath the gate electrode 60g, and does not contact the source electrode 60s and the drain electrode 60d. A gap is disposed between (i) the gate insulator film 350 and the source electrode 60s, (ii) and the gate insulator film 350 and the drain electrode 60d in the plan view.

A thickness, material, and the like of the gate insulator film 350 are the same as the thickness, material, and the like of the gate insulator film 50 according to Embodiment 1. The gate insulator film 350 is formed by removing a portion of the insulator film formed on an entire area of the barrier layer 40 through photolithography, etching, and the like. The removed region of the insulator film is larger than the electrode disposition regions 50s and 50d for forming the source electrode 60s and the drain electrode 60d.

The insulator film 380 is disposed between the gate electrode 60g and the source electrode 60s and between the gate electrode 60g and the drain electrode 60d. The insulator film 380 is formed using, for example, a material having insulating properties such as aluminum oxide or silicon oxide. Note that the insulator film 380 may cover the gate electrode 60g, the source electrode 60s, and the drain electrode 60d. The insulator film 380 may be, for example, a passivation film that covers an entirety of a top surface of the semiconductor device 301.

Due to a portion of the gate insulator film 350 being removed, the semiconductor device 301 according to the present embodiment makes it possible to limit a decrease in the 2DEG 31 directly beneath the removed portion. It is possible to limit a decrease in the ON resistance by limiting a decrease in the carriers of the 2DEG 31.

Figure 12:
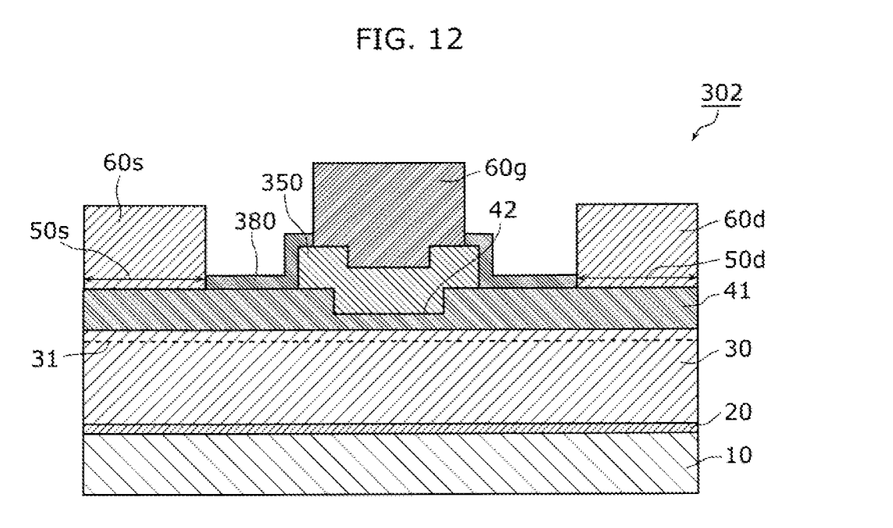
FIG. 12 is a cross-sectional view of a configuration of another semiconductor device according to Embodiment 4.

Note that the semiconductor device 301 according to the present embodiment may have a gate-recess structure, similar to the variation according to Embodiment 1. FIG. 12 is a cross-sectional view of a configuration of the semiconductor device 302 according to a variation of the present embodiment.

As illustrated in FIG. 12, the semiconductor device 302 differs from the semiconductor device 301 shown in FIG. 11 in that the semiconductor device 302 includes the barrier layer 41 in which the gate recess 42 is disposed instead of the barrier layer 40.

This makes it possible to not only produce the same advantageous effects as the semiconductor 301 according to Embodiment 4, but also shift the threshold voltage to the positive side, similar to the semiconductor device 2 according to the variation of Embodiment 1.

Note that the gate insulator film 350 may have a three-layer structure or a two-layer structure, similar to Embodiment 2 and the variation thereof.

Variations

The semiconductor device according to one or more aspects has been described above based on the embodiments, but the present disclosure is not limited thereto. Forms realized by optionally combining components and functions in the embodiments, and forms obtained by various combinations of the components in the different embodiments that can be conceived by a person skilled in the art which are within the scope of the essence of the present disclosure are also be included in the scope of the present disclosure.

For example, in the above embodiments, an example of the oxynitride film, which forms the threshold value control layer, including AlON is described, but the oxynitride film is not limited thereto. The oxynitride film may include silicon (Si), tantalum (Ta), or titanium (Ti) instead of aluminum or in addition to aluminum. To be specific, the oxynitride film may include SiON, TaON, TiON, or the like. It is possible to adjust the threshold voltage of the semiconductor device by adjusting the nitrogen composition ratio regardless of which oxynitride film is used.

The nitride semiconductor layer having an MIS structure may have, for example, a stacked structure of multiple AlGaN films with different composition ratios and different band gaps. The nitride semiconductor layer may also have a stacked structure of GaN and InGaN.

Various modifications, substitutions, additions, and omissions are possible in the scope of the claims and equivalent scopes of the above embodiments.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The present disclosure can be used as a semiconductor device having a desired threshold voltage, and can, for example, be used for a high-frequency and high-output electronic device such as a power switching element.

The invention claimed is:

1. A semiconductor device, comprising:
 a metal-insulator-semiconductor (MIS) structure that includes a nitride semiconductor layer, a gate insulator film, and a gate electrode stacked in stated order; and
 a source electrode and a drain electrode that are disposed to sandwich the gate electrode in a plan view and contact the nitride semiconductor layer, wherein
 the gate insulator film is a single layer of a threshold value control layer that includes an oxynitride film,
 the threshold value control layer is in contact with each of the gate electrode and the nitride semiconductor layer,
 a nitrogen content in the threshold value control layer decreases from the nitride semiconductor layer toward the gate electrode, and
 a nitrogen composition ratio of the threshold value control layer is 7 at. % around an interface between the threshold value control layer and the nitride semiconductor layer, and is 3 at. % around an interface between the threshold value control layer and the gate electrode.

2. The semiconductor device according to claim 1, wherein
 the threshold value control layer contains aluminum.

3. The semiconductor device according to claim 1, wherein
 the threshold value control layer is amorphous or microcrystalline.

4. The semiconductor device according to claim 1, wherein
 the gate insulator film further includes a first insulation layer that is stacked on the threshold value control layer at a side of the gate electrode and includes one of an oxide film, a nitride film, or an oxynitride film.

5. The semiconductor device according to claim 1, wherein
 the gate insulator film further includes a second insulation layer that is stacked on the threshold value control layer at a side of the nitride semiconductor layer and includes one of an oxide film, a nitride film, or an oxynitride film.

6. The semiconductor device according to claim 1, wherein
 the gate insulator film further includes:
 a first insulation layer that is stacked on the threshold value control layer at a side of the gate electrode and includes one of an oxide film, a nitride film, or an oxynitride film; and
 a second insulation layer that is stacked on the threshold value control layer at a side of the nitride semiconductor layer and includes one of an oxide film, a nitride film, or an oxynitride film.

7. The semiconductor device according to claim 1, wherein
 the nitride semiconductor layer has a stacked structure of GaN and $Al_xGa_{1-x}N$, where $0 \le x \le 1$.

8. The semiconductor device according to claim 1, wherein
 a gate recess is disposed in the nitride semiconductor layer.

9. The semiconductor device according to claim 8, wherein
 the nitride semiconductor layer includes:
 a first nitride semiconductor layer; and
 a second nitride semiconductor layer that is stacked on the first nitride semiconductor layer at a side of the gate electrode and includes the gate recess, and
 the first nitride semiconductor layer includes a recess that is disposed at a position overlapping the gate recess in the plan view and is recessed from the gate electrode toward the nitride semiconductor layer.

10. The semiconductor device according to claim 9, wherein
 the second nitride semiconductor layer has a uniform film thickness along an inner surface of the recess.

11. The semiconductor device according to claim 1, further comprising:
 a spacer layer disposed between the nitride semiconductor layer and the gate insulator film, wherein
 the spacer layer is located between the gate electrode and the source electrode and between the gate electrode and the drain electrode in the plan view.

12. The semiconductor device according to claim 11, wherein
 a portion of the spacer layer overlaps the gate electrode in the plan view.

13. The semiconductor device according to claim 1, wherein
 the gate insulator film is not disposed in at least a portion between the gate electrode and the source electrode and between the gate electrode and the drain electrode in the plan view.

14. The semiconductor device according to claim 3, wherein
 the gate insulator film further includes a first insulation layer that is stacked on the threshold value control layer at a side of the gate electrode and includes one of an oxide film, a nitride film, or an oxynitride film.

* * * * *